United States Patent [19]

Greenspan et al.

[11] Patent Number: 4,502,100
[45] Date of Patent: Feb. 26, 1985

[54] COOLING SYSTEM WITH COUNTER FLOW OF COOLANT

[75] Inventors: Stephen B. Greenspan; Omkarnath R. Gupta, both of Boca Raton, Fla.

[73] Assignee: International Business Machines Corporation, Armonk, N.Y.

[21] Appl. No.: 444,411

[22] Filed: Nov. 24, 1982

[51] Int. Cl.³ .............................................. H05H 7/20
[52] U.S. Cl. .................... 361/384; 165/122; 361/415
[58] Field of Search ............... 361/380, 381, 383, 384, 361/385, 386, 390, 391, 415; 174/16 R; 165/122

[56] References Cited

U.S. PATENT DOCUMENTS

| | | | |
|---|---|---|---|
| 2,843,806 | 7/1958 | O'Neill | 361/379 |
| 3,198,991 | 8/1965 | Barnett | 361/384 |
| 3,411,041 | 7/1967 | Block | 361/381 |
| 3,477,502 | 11/1969 | Katz | 165/122 |
| 3,528,492 | 3/1967 | Austin | 165/80 R |
| 3,549,949 | 12/1970 | Granberry | 361/381 |
| 3,858,090 | 12/1974 | Lehmann | 361/385 |
| 4,133,022 | 1/1979 | Moore et al. | 361/415 |
| 4,133,374 | 1/1979 | York | 165/122 |
| 4,293,891 | 10/1981 | Matsui et al. | 361/383 |
| 4,386,651 | 6/1983 | Reinhard | 361/384 |

FOREIGN PATENT DOCUMENTS

| | | |
|---|---|---|
| 3044135 | 3/1982 | Fed. Rep. of Germany . |
| 178351 | 11/1983 | Japan . |
| 2045537 | 10/1980 | United Kingdom . |

Primary Examiner—A. D. Pellinen
Assistant Examiner—Gregory D. Thompson
Attorney, Agent, or Firm—D. Kendall Cooper

[57] ABSTRACT

A cooling system is described for modules on electronic circuit cards, the system typically containing a multiplicity of cards. Improved cooling is achieved due to improved boundary layer conditions established by counter air flow in opposite directions on opposite sides of the cards.

2 Claims, 8 Drawing Figures

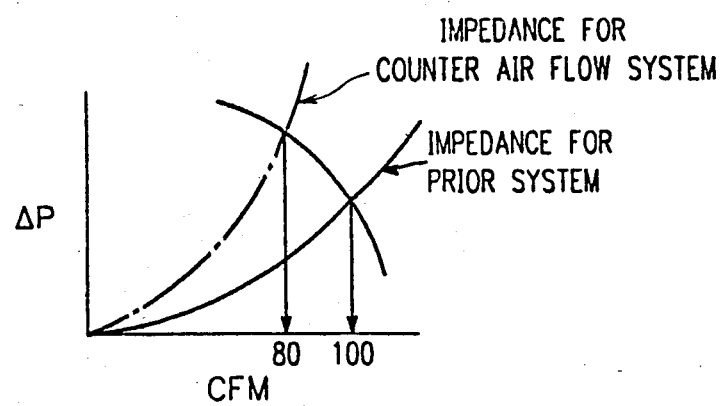
Fig. 3
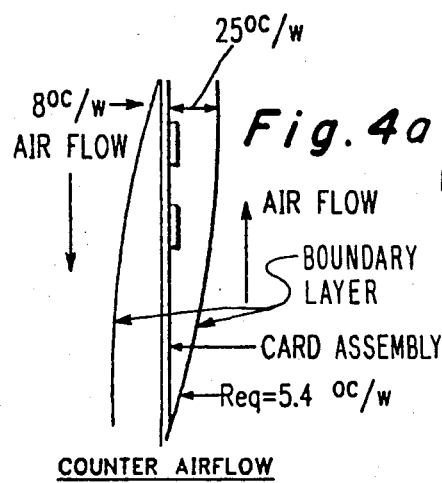
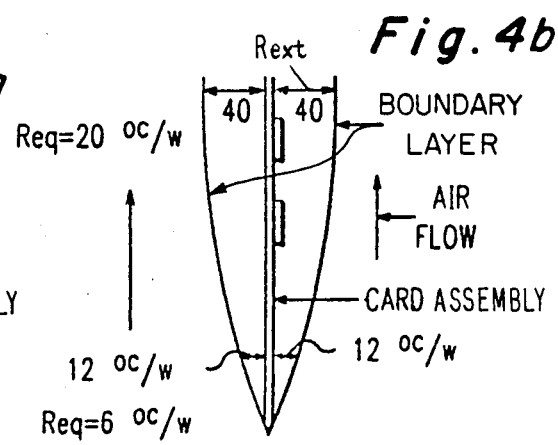

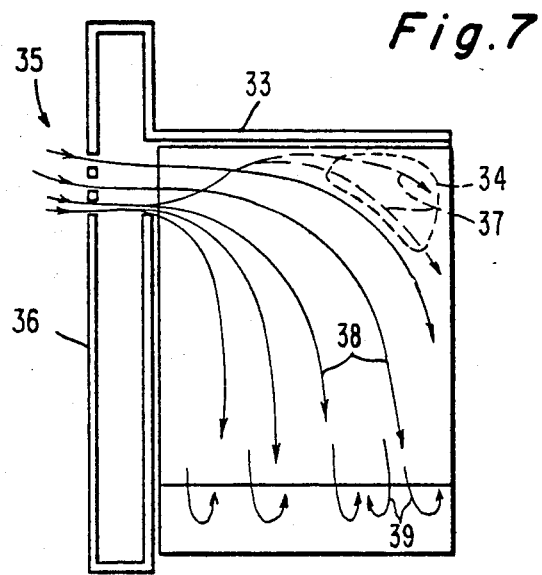

COOLING SYSTEM WITH COUNTER FLOW OF COOLANT

BACKGROUND OF THE INVENTION

This invention relates to cooling systems for electronic circuitry, for example, and more particularly to a more efficient arrangement of this nature having improved cooling performance. Cooling is enhanced without increasing blower (fan) size and relatively uniform cooling is achieved.

Systems of this nature have been described heretofore wherein cooling of electronic circuitry and the like has been achieved by horizontal or vertical cross ventilation rather than counter flow ventilation as described herein. Both air and liquid fluids have been utilized as coolants. Examples of such cooling systems are shown in the U.S. Pat. Nos. 2,843,806, 3,549,949, and 3,858,090. An example of the use of air directed in opposite directions through an apparatus for cooling purposes is the U.S. Pat. No. 3,528,492 to Austin which is shown in FIG. 12 for example, the use of a cooling fluid such as ambient air directed in opposite directions through alternate cooling fluid ducts to effect cooling of modules in a microwave apparatus. The Austin apparatus makes use of alternate oppositely directed substantially independent (at least downstream) fluid flow paths for cooling, each with its own set of input and exhaust ports and ducts.

The U.S. Pat. No. 3,411,041 to Block shows in FIGS. 7 and 8, for example, the provision of passages 38 and slots 42 with separators 55 to establish flow of the coolant in opposite directions through cells 44.

SUMMARY OF THE INVENTION

In accordance with the present invention, cooling apparatus is provided for electronic devices, such as circuit cards, for example, the apparatus utilizing a counter flow cooling scheme. The apparatus achieves improved and more uniform thermal performance for a given fluid coolant system capability.

In the practice of the present invention, increased thermal performance is attained with decreased system air flow due to improved boundary layer conditions along each electronic card.

In a first embodiment described herein, a cooling system is assembled integral with an electronic circuit card module, the system having air directing blockage or baffle elements and cooperating plenum elements. Air passes in a downward direction and in parallel past a plurality of the circuit cards, then is routed underneath all of the circuit cards to pass in an upward direction to cool the opposite sides of the cards and thereafter exhausted by way of a common set of exit openings. In other embodiments, the baffling and plenum elements are modified for further control of air flow.

The present invention is especially characterized by the following features:

(1) Same intake air is on both sides of the cards (e.g. serial flow) resulting in counterflow;
(2) Non-uniform air velocities;
(3) Non-uniform boundary layer design;
(4) Lower velocity air flow with lower temperature coolant, higher velocity air flow with higher temperature coolant.

BRIEF DESCRIPTION OF THE DRAWINGS

Referring to the drawings:

FIG. 3 illustrates air flow impedance relationships in the counter flow system of FIG. 1 and the prior art apparatus of FIG. 2.

FIGS. 4a and 4b illustrate air flow and thermal resistance relationships in the systems of FIGS. 1 and 2 respectively.

FIGS. 6 and 7 illustrate alternate baffling and plenum structures for modifying the air flow of the system of FIGS. 1 and 5.

ABBREVIATIONS

The following abbreviations are occasionally used herein:

| Abbreviations | Definitions |
| --- | --- |
| CFM | Cubic Feet per Minute (Volume Flow Rate) |
| ΔP | Pressure Drop (expressed in inches of water - for blowers) |
| oc/w | Degrees Centigrade per Watt - a measure of thermal resistance |
| Req | Equivalent Thermal Resistance (oc/w) |
| Rext | External Thermal Resistance (oc/w) |
| Rmax | Maximum Thermal Resistance |
| Rmin | Minimum Thermal Resistance |
| ≈ | Approximate |

DESCRIPTION OF SYSTEM UTILIZING COUNTER AIR FLOW COOLING

The cooling apparatus of the present invention provides (1) enhanced cooling for electronic packages without increasing the blower size thereby avoiding increased noise level and (2) relatively uniform cooling irrespective of module locations on the circuit cards. Counter air flow is provided on two sides of individual circuit cards and velocity of the air builds up as the air gets hotter due to circuit card operation.

Figure 1:
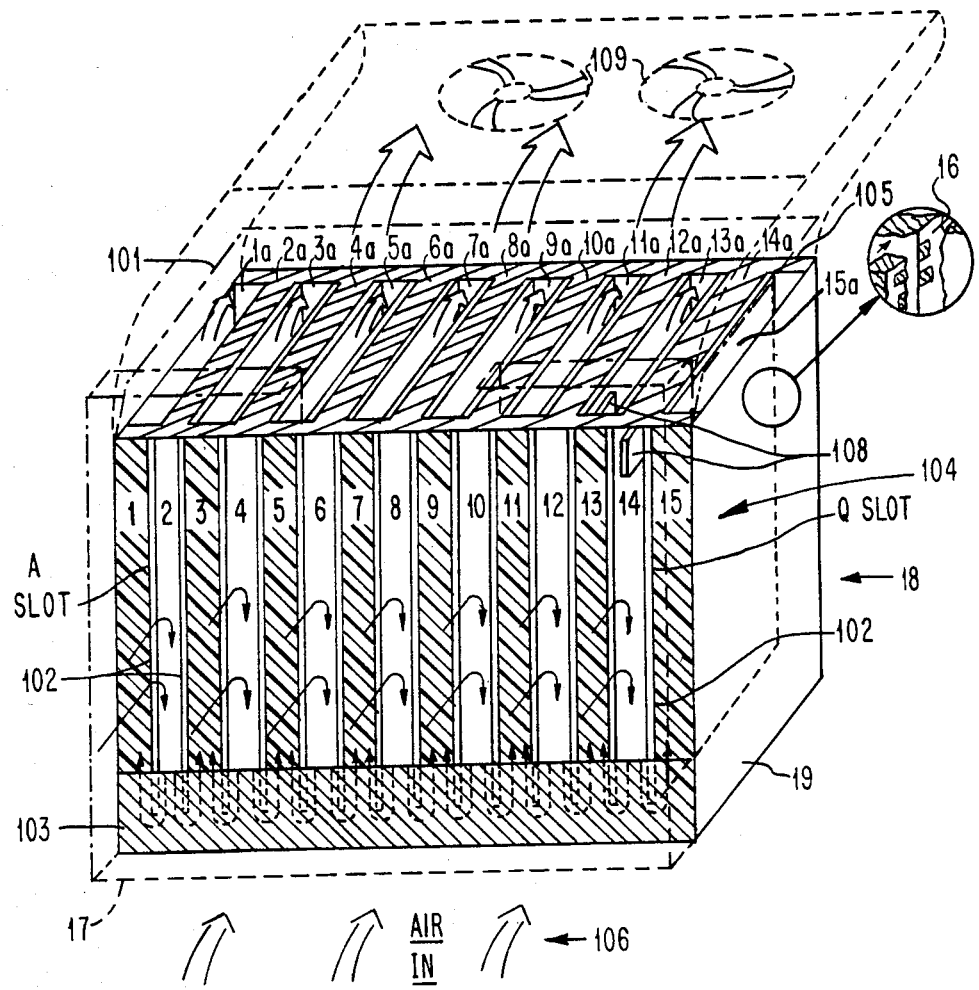
FIG. 1 illustrates a first embodiment of the counter flow cooling system using air as the coolant and integrally formed with an electronic circuit card assembly.
Figure 2:
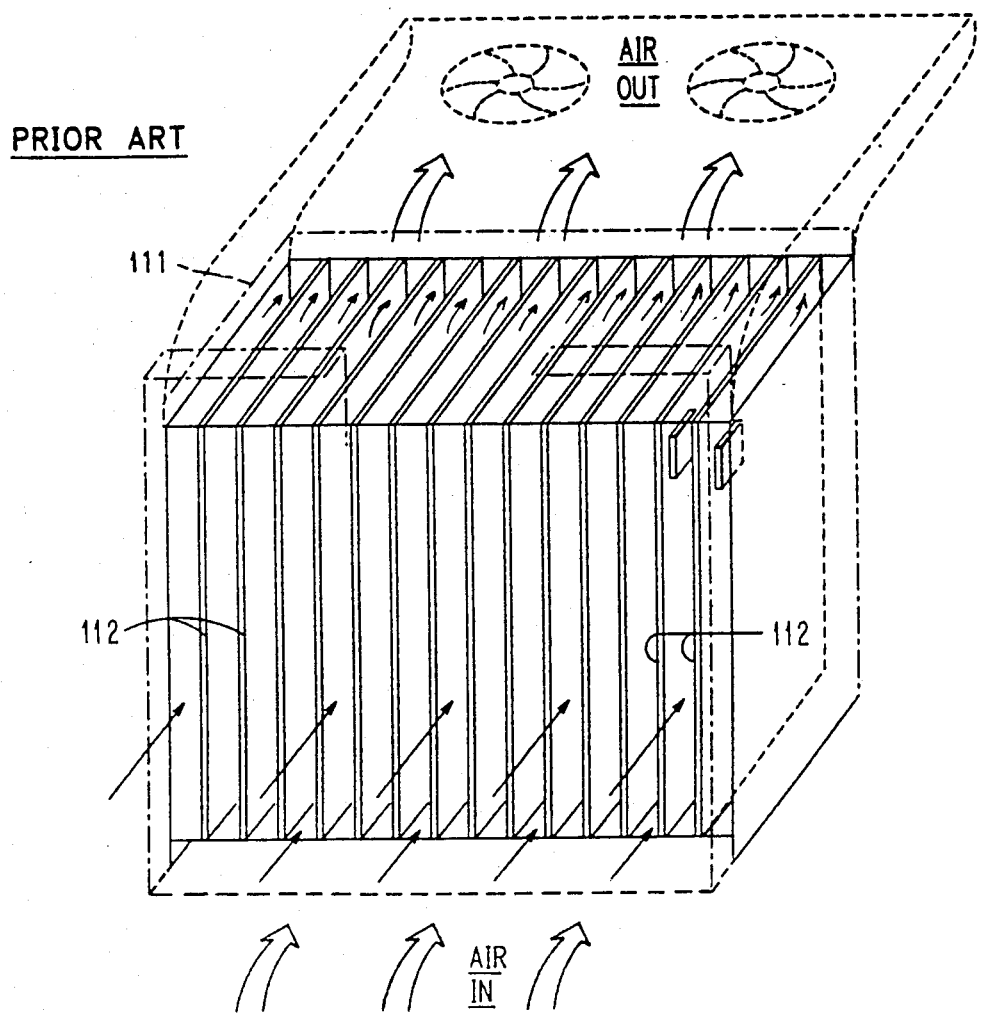
FIG. 2 illustrates a prior cooling apparatus with electronic circuit card assembly and essentially straight through air flow.

The counter air flow cooling system is shown in FIGS. 1 and 5-7 and a prior system is shown in FIG. 2. In FIG. 1 the shaded areas represent blocked or enclosed areas in front and on top of an electronics assembly 101 having a "mother board" such as those provided in a computer. Assembly 101 has bottom, rear, and side enclosed surfaces respectively designated 17, 18, and 19 and has an array of circuit cards substantially congruent with side surfaces of assembly 101, such as cards 102 received and supported in slots 16 sometimes designated A-Q. The cards have circuit modules such as modules 108 that are shown in areas 13 and 14. An arrangement of baffles and open entry passageways is located on the front portion 104 of assembly 101, the baffles being designated 1, 3, 5, etc. through 13 and 15 and the open passageways being designated 2, 4, 6, etc. through 12 and 14. Front baffles 1, 3, 5, etc. are formed by foam or plastic edge connectors, for example, which are snapped in place at the front ends of alternate pairs of the circuit cards to prevent air flow at the front between those pairs of cards. This also defines even numbered entry passageways 2, 4, 6, etc. between other alternate pairs of circuit cards to allow air flow therebetween. Baffles 2a, 4a, 6a, etc. are formed on the top portion of assembly 101, for example, by a single sheet of sheet metal 105 to block air flow between the top edges of the same pairs of circuit cards having front entry passageways 2, 4, 6, etc. Sheet metal 105 also defines odd numbered exit passageways 1a, 3a, 5a, etc. to allow air flow between the top edges of the same pairs of circuit cards having air flow prevented on their front edges by baffles 1, 3, 5, etc.

Air acting as a coolant enters from the front of the assembly at 106 and is drawn into the assembly by fans 109. Air in odd columns defined by baffles 1, 3, 5, etc. goes up and in even columns defined by passageways 2, 4, 6, etc. goes down. The front blockage 103 at the bottom of the assembly serves as an entry plenum where air enters the system and further where air from even columns turns around and goes up through the odd columns. Entry plenum 103 and at least the bottom closed surface of assembly 101 define a common passageway for air flow between the entry and exit air flow baffle 104 on the front portion and top portion 105 of assembly 101. A card slot with a hot logic card, such as card 102, gets fresh air going up in front as well as fresh air going down thus providing extra cooling. Air from all the odd columns is pulled out at the top of the assembly by fans 109. Thus, the fluid agent air is directed into the system via the front entry passageways 2, 4, 6, etc. defined by front entry baffles 1, 3, 5, etc. and air passes out of the system via top exit passageways 1a, 3a, 5a, etc. defined by the top exit baffles in areas 2a, 4a, 6a, etc. With counter air flow, air is provided on two sides of all circuit cards. In addition, the system is capable of enhancing the cooling of a hot electronic module in any position on the cards, such heat customarily resulting from high electrical power consumption.

DESCRIPTION OF PRIOR ART COOLING SYSTEM

A representative prior cooling scheme is illustrated in FIG. 2 and includes an electronics assembly 111 with sheet metal formed to control air flow from bottom to top past circuit cards, such as card 112. Air flow on both sides of any individual card is in parallel. The boundary layer on both sides of the cards starts at the bottom. It is thinner at the bottom and thicker at the top. Moreover, air at the bottom is cooler and air at the top is hotter. Thus, the ratio of the lowest thermal resistance to best thermal resistance at the same air velocity (a measure of cooling efficiency) is more than 3.

COMPARISON OF COUNTER AIR FLOW AND PRIOR ART SYSTEMS

Reference is made to FIG. 3 which represents air flow impedance relationships. Additionally, reference is made to FIG. 4a which illustrates conditions with counter air flow in opposite directions on two sides of an individual circuit card and to FIG. 4b which illustrates the prior art with air flow in the same direction on both sides of a circuit card.

Enhanced card cooling occurs in the present system when compared to prior systems by providing counter air flow on two sides of a given logic card in a multi-card system such as that illustrated. By doing this even though total Cubic Feet per Minute (CFM) per electronics assembly goes down, the following advantages accrue:

1. Tests have indicated there is a 60% increase in air velocity past each card. This is so because two card columns are in series. Even though the tests also indicate that the total CFM goes down to 80%, the parallel air passages go down to half and thus the increase of mass flow rate through each card column is 60% (11.4 CFM from 7.1 CFM).
   (a) CFM/card column in prior system = 100/14 = 7.1 CFM
   (b) CFM/card column in present counter air flow system = 80/7 = 11.4 CFM The two systems have the same number of cards, that is fourteen (14). However, with reference to FIGS. 4a and 4b, the counter airflow approach, also illustrated in FIG. 1, each pair of cards, for instance, the two cards on either side of entry passageway 2 act as a single card surface due to the baffles 1, 3, and 2a. Similarly, the two cards on either side of entry passageway 4 act as a single card surface due to the baffles 3, 5, and 4a. Hence, for the 14-card configuration, the baffles reduce the net card surface count to 7 although each card surface has twice the length. (See FIG. 4a)

2. The fresh air in even columns is going down and even though the velocity is low, the air is cooler and thus provides good cooling of one side of each card. The air in odd columns (now heated) is going up, has higher air velocity and thus provides good cooling on the other sides of the cards.

3. The counter air flow scheme allows fresh air to both sides of a card (such as circuit card in Q-slot) to enhance the cooling.

4. The counter flow of air gives additional beneficial effects, such as uniform external resistance on the side of an individual card. Air is going downwardly (even columns), the thermal boundary layer starts from the top and thickens downwardly. The thicker the boundary layer, the higher is the external thermal resistance. On the other side of the card where the now heated air is going up, the thermal boundary layer starts from the bottom of the card and thickens upwardly. This provides uniform cooling throughout the card. At the top, thermal resistance is lower on the side of the card with respect to which the air is flowing downwardly and thermal resistance is higher on the other side where the air is flowing upwardly. At the bottom of the cards, thermal resistance is higher on the side air is flowing downwardly but is lower on the side with respect to which air is flowing upwardly. Thus uniform thermal resistance is provided all over the individual cards. The ratio of worst thermal resistance to best thermal resistance is approximately 1.2.

Advantages of the counter air flow cooling scheme include:

1. The counter air flow cooling provides a reduction in the highest/lowest resistance ratio to approximately 1.2.

2. The highest thermal resistance is improved due to increased air velocity which may be in the range of a 60% increase and reduced boundary layer.

3. Extra cooling is provided to warmer circuit card slots such as the Q slot.

4. Lower noise level due to the fact that there is reduced air flow through the system.

ALTERNATIVE EMBODIMENTS

Figure 5:
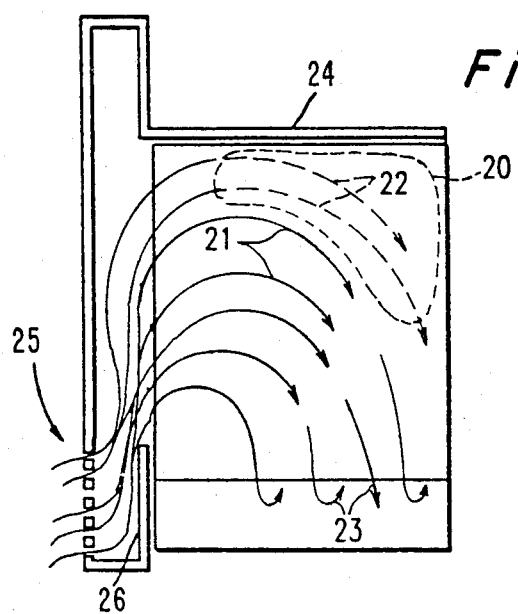
FIG. 5 is a side view showing direction of air flowing down in the system of FIG. 1.
Figure 6:
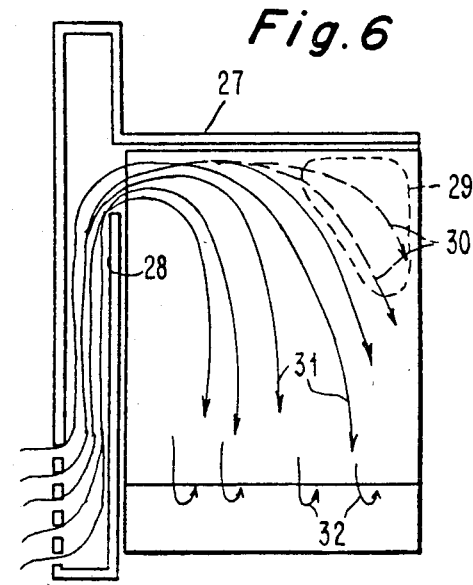

Reference is now made to FIGS. 5-7. FIG. 5 represents a right side cross-sectional view of the apparatus of FIG. 1 with assembly 24 having a front grill 25 and blockage or baffle 26 of predetermined height. FIGS. 6 and 7 represent cross-sectional views of alternative baffling and plenum arrangements. Under some circumstances, air flow for even numbered areas where air is going down may result in an area near the top of the card such as area 20, FIG. 5, not receiving as much air flow.

FIG. 5 illustrates a side view of a circuit card in an even numbered area, for example, with the solid arrows such as arrows 21 (more air flow) and dashed arrows 22 (less air flow) indicating air flow along side the card and arrows 23 indicating return air flow to the other side, for example, in an odd numbered area.

The air flow conditions may be modified as shown in FIG. 6 if desired by extending the front blockage plate or baffle 28 in assembly 27 almost to the top of the cards, baffle 28 thereby serving as an intermediate plenum. Now the air flow enters the card columns from the tops of the circuit cards rather than from the lower centers of the cards thus reducing the area of lesser air flow as at 29, FIG. 6. The resulting air flow is indicated by arrows 30, 31, and 32.

Another approach offering efficient air flow is shown in FIG. 7. Here assembly 33 has an air intake area or grill 35 at the top of the enclosure 36 further enhancing air flow at the top of each electronic circuit card.

EXHAUST FAN CONFIGURATIONS

FIGS. 8 and 8b represent side elevations of the exhaust fan configuration. The front of the system enclosure has front baffle structure 40. The rear of the system enclosure is identified by 44. Air enters the system through louvered structure 46, with airflow identified as 45. Two fan configurations are shown with fans 42 positioned toward the rear of the enclosure as in FIG. 8a or fans 52 positioned directly over the enclosure as in FIG. 8b. The exhaust structure 43, FIG. 8a, is completely enclosed with the exception of open grills 43a. FIG. 8b is similar with exhaust structure 53 and open grills 53a. Thus, with reference to FIG. 8a, airflow 45 through the system enclosure enters at louvers 46, circulates vertically as shown in FIG. 5 or FIG. 6, exits into the exhaust structure 43, as airflow 41a, and exits the system enclosure at baffles or grills 43a, as exhaust airflow 41. The configuration in FIG. 8b is structured in a similar fashion with front baffle structure 54a, rear surface 54 louvers 56, airflow 57, airflow 51a, grills 53a and airflow 51. FIG. 9 illustrates a card assembly 63, with electronic components shown. Component 61 is a radial lead passive device commonly used in electronic systems; component 62 is a pin grid array logic or memory device commonly used in electronic systems. Airflow enters the system at louvers 66, as airflow 65. Internal airflow across the face of the electronic card assembly 63 is shown as 67. The total system is enclosed by housing 64.

While several embodiments of the invention have been illustrated and described, it is to be understood that there is no intention to limit the invention to the precise structures herein disclosed and the right is reserved to all changes and modifications coming within the scope of the invention as defined in the appended claims.

We claim:

1. A counter flow cooling assembly which cools electronic circuit cards with an air cooling agent, said assembly having enclosed rear, oppositely positioned side, and bottom surfaces and further having unenclosed front and top portions thereof and said assembly comprising;

support means including slotted receptacles on the rear inside surface of said assembly supporting an array of said circuit cards in spaced apart relationship from side to side within said assembly, each of said circuit cards having an area substantially congruent with the area of either of said side surfaces of said assembly and each circuit card in one dimension from rear to front of said assembly having substantially the same dimension as the rear to front dimension of a said side surface but each circuit card in a transverse direction from top to bottom within said assembly having a substantially shorter dimension than the top to bottom dimension of said side surfaces thereby establishing a common air flow area between the lowermost edges of said circuit cards and the bottom surface of said assembly;

a first set of air flow baffles positioned on the front edges of selected alternate pairs of said circuit cards to block and prevent passage of air between said selected alternate pairs of said circuit cards, said first set of air flow baffles further also defining entry passageways for passage of air between alternate pairs of circuit cards not blocked by said first set of air flow baffles;

a second set of air flow baffles abutting the top edges of said circuit cards to block and prevent passage of air between the top edges of the same selected alternate pairs of circuit cards having front entry passageways therebetween established by the first set of air flow baffles, said second set of air flow baffles further defining a set of exit passageways for passage of air between alternate circuit cards not blocked by said second set of air flow baffles;

a plenum mounted at the lowermost ends of said first set of air flow baffles to further define an air flow entry area for said assembly;

exhaust fan means directing air through said assembly including passage through said entry passageways at the front edges of said circuit cards, through said common air flow area, and through said exit passageways to establish flow of air through said systems substantially in a downward direction past even numbered alternate pairs of said circuit cards as air passes from said entry area to said common air flow area at the bottom of said circuit cards the air in going downwardly acquiring heat from the circuit cards and creating a thermal boundary layer relative to said circuit cards which starts from the top and which thickens downwardly, with the thicker boundary layer having a higher external thermal resistance, and to further establish flow of air substantially in an upward direction past odd numbered alternate pairs of said circuit cards as air passes from said common air flow area through said exit passageways, the now heated air in going upwardly acquiring additional heat from the circuit cards and creating a thermal boundary layer relative to said circuit cards that starts from the bottom of the cards and thickens upwardly, the thicker boundary layer having a higher external thermal resistance, thereby cooling said circuit cards more effectively due to counter flow passage of air on both sides of each circuit card which establishes uniform thermal resistance characteristics and enhanced boundary layer conditions all over said circuit cards.

2. The cooling system of claim 1 wherein said entry plenum covers substantially the entire entry area except for that portion of said entry passageways near the uppermost portions of said circuit cards to establish a longer air flow path to said common air flow area thereby insuring maximum air flow at the top of said circuit cards and hence a more enhanced cooling effect of said circuit cards.

* * * * *